(12) United States Patent
Miyatake et al.

(10) Patent No.: US 6,539,324 B2
(45) Date of Patent: Mar. 25, 2003

(54) SEMICONDUCTOR DEVICE AND SEMICONDUCTOR DEVICE TESTING METHOD

(75) Inventors: Hisatada Miyatake, Ohtsu (JP); Yotaro Mori, Shiga-ken (JP); Masahiro Tanaka, Morigama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,862

(22) Filed: Jun. 19, 2001

(65) Prior Publication Data

US 2002/0029123 A1 Mar. 7, 2002

(30) Foreign Application Priority Data

Jul. 12, 2000 (JP) ........................................ 2000-211898

(51) Int. Cl.[7] .................. G01R 27/28; G01R 31/00; G01R 31/14; G06F 19/00
(52) U.S. Cl. .................. 702/117; 714/718; 714/719; 714/720
(58) Field of Search .......................... 702/117; 714/720, 714/733, 734, 30

(56) References Cited

U.S. PATENT DOCUMENTS

| | | | | |
|---|---|---|---|---|
| 4,812,982 A | * | 3/1989 | PeBenhofer | 700/226 |
| 5,107,501 A | * | 4/1992 | Zorian | 714/720 |
| 5,294,911 A | * | 3/1994 | Uchida et al. | 340/146.2 |
| 5,946,246 A | * | 8/1999 | Jun et al. | 365/201 |
| 5,964,857 A | * | 10/1999 | Srinivasan et al. | 710/244 |
| 6,148,426 A | * | 11/2000 | Kim et al. | 714/733 |
| 6,272,588 B1 | * | 8/2001 | Johnston et al. | 711/106 |
| 6,286,116 B1 | * | 9/2001 | Bhavsar | 714/720 |
| 6,317,350 B1 | * | 11/2001 | Pereira et al. | 365/49 |

* cited by examiner

Primary Examiner—Marc S. Hoff
Assistant Examiner—Mary Catherine Baran
(74) Attorney, Agent, or Firm—Anthony J. Canale; Robert A. Walsh (57) ABSTRACT

It is one object of the present invention to eliminate redundant testing steps from an operation for testing the search function of a content addressable memory having a priority encoder. Before testing is conducted, background data that differ from test data are written (step 21). Then, the background data are read (step 22) and are tested (step 23). The address having the lowest priority is designated (step 26). And the test data are written thereto (step 27). Following this, the search operation is performed (step 28) to determine whether test addresses match search addresses (step 29). Then, the address having the second lowest priority is designated (step 26), and the above processing is repeated for all the addresses (step 32).

26 Claims, 7 Drawing Sheets

| Line number | Command |
|---|---|
| 1 | Write '00...00000' to all addresses |
| 2 | Read all addresses |
| 3 | Write '11...11111' to addresses X |
| 4 | Search '11...11111' |
| 5 | Write '11...11111' to addresses X-1 |
| 6 | Search '11...11111' |
| ... | . . . |
| 2x-1 | Write '11...11111' to addresses 1 |
| 2x | Search '11...11111' |
| 2x+1 | Write '11...11111' to addresses 0 |
| 2x+2 | Search '11...11111' |

FIG. 7

(a)
step 2

| Address | Data |
|---|---|
| 0 | 000...00000 |
| 1 | 000...00000 |
| 2 | 000...00000 |
| ⋮ | ⋮ |
| x-2 | 000...00000 |
| x-1 | 000...00000 |
| x | 000...00000 |

(b)
step 4

| Address | Data |
|---|---|
| 0 | 000...00000 |
| 1 | 000...00000 |
| 2 | 000...00000 |
| ⋮ | ⋮ |
| x-2 | 000...00000 |
| x-1 | 000...00000 |
| x | 111...11111 |

(c)
step 6

| Address | Data |
|---|---|
| 0 | 000...00000 |
| 1 | 000...00000 |
| 2 | 000...00000 |
| ⋮ | ⋮ |
| x-2 | 000...00000 |
| x-1 | 111...11111 |
| x | 111...11111 |

(d)
step 2x

| Address | Data |
|---|---|
| 0 | 000...00000 |
| 1 | 111...11111 |
| 2 | 111...11111 |
| ⋮ | ⋮ |
| x-2 | 111...11111 |
| x-1 | 111...11111 |
| x | 111...11111 |

(e)
step 2x+2

| Address | Data |
|---|---|
| 0 | 111...11111 |
| 1 | 111...11111 |
| 2 | 111...11111 |
| ⋮ | ⋮ |
| x-2 | 111...11111 |
| x-1 | 111...11111 |
| x | 111...11111 |

FIG. 8

SEMICONDUCTOR DEVICE AND SEMICONDUCTOR DEVICE TESTING METHOD

BACKGROUND OF THE INVENTION

1. Field of the Invention

The present invention relates to a semiconductor device and to a method for testing a semiconductor device, and in particular to a semiconductor device and a semiconductor device testing method that together provide an effective means for efficiently testing a content addressable memory (CAM) cell, a word matching circuit and a priority encoder.

2. Background of the Invention

A content addressable memory (CAM) has a function for the entry of reference data, and the output of an address whereat data are recorded that match the reference data. Of course, the CAM also has the same memory functions as a common memory device for selecting the address of a memory cell and to write data thereto or to read data therefrom.

The data search function is carried out using a reference data line provided for the CAM, and a search result output line for outputting the result obtained from a comparison of the reference data and the stored data. The reference data and the stored data are compared bit by bit at every word along the word line corresponding to every address. Subsequently, the comparison results are transferred to the search result output line, whereby they are transmitted to a word matching circuit. When the data for all the word bits, or if there are masked word bits, the data for word bits that are not masked, have been matched, a matching flag is output to the output terminal of the word matching circuit provided for each word line. The address of the word line whereat the matching flag is set is output by a priority encoder. When a plurality of words are matched, the priority encoder determines the priority order, and outputs the address having the highest priority. For determination of the priority order, for example, the highest priority is allocated to the address having the smallest address number.

It should be noted that content addressable memory is described, for example, in the "LSI Handbook", Institute of Electronic Communication, by Ohm Co., Ltd., Nov. 30, 1984, pp. 523–525.

When such a CAM is manufactured, the storage and reading operation for the memory cell must be tested to determine whether it is correct, and the operation of the word matching circuit and the priority encoder, i.e., the search function, must also be tested to determine whether it is correct. The testing can be conducted as follows. Test data are written to a CAM array at a designated test address which is employed as reference data to perform a search. The search address that is output is compared to the test address to determine the correctness of the search operation.

As previously described, when there are a plurality of words that match the reference data, the priority encoder outputs one search result (searched address) in accordance with the priority order. Therefore, the testing step must include the following conditions: (1) the same data as the test data should not be stored at an address having a higher priority than the test address; and (2) when the address to be tested is other than an address having the lowest priority, the same data as the test data should be stored in at least one address having a lower priority than the test address.

When the same data as the test data are recorded at the address having the higher priorities, the address whereat the data are recorded is output as the search result. Even when the CAM is operated correctly, the test addresses do not match the searched addresses, and the correctness of the operation of the CAM can not be determined. Condition (1) is required in order to avoid this occurrence. If condition (2) is not satisfied even when condition (1) has been established, it can be determined whether an address having a high priority has been correctly selected among the addresses whereat the data match.

A test is conducted for all the addresses while taking the above conditions into account. When an address that matches a test address is correctly output for all addresses, the correctness of the CAM is confirmed.

Assuming that the test is begun with the address having the highest priority defined by the priority encoder and is continued using addresses having lower priorities, the following problem arises. In order to establish the above conditions, the data stored at the preceding test address must be rewritten into the background data (or data different from the test data), and the same data as the test data must be written to the address following the test address having lower priorities. This operation is not preferred because the number of test steps for each address is increased. Further, while taking into account the fact that the search function is mounted in a built-in self test circuit on the chip of the semiconductor device, the number of circuits is increased, and accordingly, the chip size or the power consumption is increased.

It is, therefore, one object of the present invention to eliminate a redundant test step during the process for testing the search function of a CAM having a priority encoder.

It is another object of the present invention to employ the minimum number of steps to detect a failure in a memory cell or a word matching circuit, and to also detect the failure of a priority encoder function.

BRIEF SUMMARY OF THE INVENTION

Summary of the Invention

An overview of the present invention will now be described. According to a semiconductor device testing method and a semiconductor device for the invention, a content addressable memory cell, a word matching circuit and a priority encoder are tested beginning at an address having the lowest priority as defined by the priority encoder.

According to this testing method, background data that differ from test data are written before the test is conducted, and the test data are written to the address, a test address, having the lowest priority. Since background data are previously written to the addresses having higher priorities, during the search operation the address whereat the test data are written (the address having the lowest priority) should be output as a search address. The search address should match the test address as long as the CAM is operated correctly.

Then, an address having the second lowest priority is generated, and the test data are written to this address as a test address, while the data at the preceding address that was tested are unchanged. Therefore, at this time, the test data are stored at the addresses having the lowest and the second lowest priorities, and the background data are stored at the other addresses. Under these conditions, the search operation is performed using the test data as reference data. As is described above, since the matching address having the highest priority must be the current test address, the test address should be output as a result of the search, and the test address should match the search address (the output address serving as the search result) so long as the CAM is operated correctly. This testing operation is repeated by designating an address having a higher priority until the testing of all the remaining addresses has been completed.

According to this testing method, the data that were previously tested are not affected. That is, no data deletion or data writing operation is performed for the data, and the same data as the test data are not written to an untested address. In other words, the data writing operation is performed for each address only once. As a result, the number of test steps can be minimized.

Furthermore, according to the semiconductor device of this invention, these test steps are mounted as a built-in self test (BIST) circuit. Since the number of test steps for the above method is minimized, the required number of circuits and the circuit size can be reduced for a circuit wherein these steps are mounted. Accordingly, a reduction in power consumption can also be realized.

DETAILED DESCRIPTION OF THE INVENTION

Detailed Description of the Invention

The preferred embodiment of the present invention will now be described in detail while referring to the accompanying drawings. It should be noted, however, that various other embodiments can be used to implement the present invention, and that the invention is not limited to this embodiment. Note further that the same reference numerals are used throughout the embodiment to denote corresponding or identical components.

Figure 1:
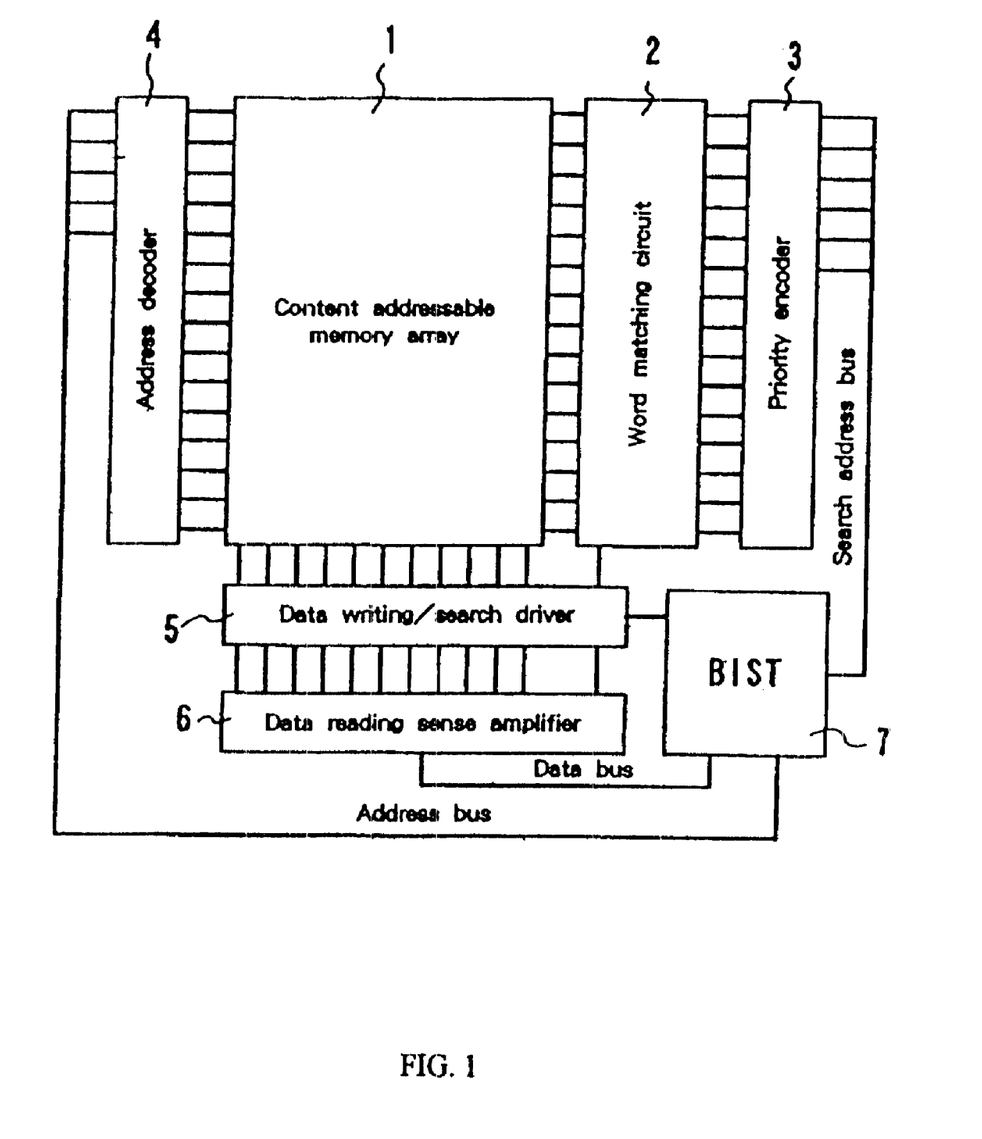
FIG. 1 is a block diagram showing an overview of a semiconductor device according to one embodiment of the present invention.

FIG. 1 is a block diagram showing an overview of a semiconductor device according to one embodiment of the present invention. The semiconductor device comprises: a content addressable memory (CAM) array 1, a word matching circuit 2, a priority encoder 3, an address decoder 4, a data writing/search driver 5, a sense amplifier 6 for data reading, and a built-in self test (BIST) circuit 7.

The CAM array 1 includes a memory cell array, wherein for each memory cell a search device is provided for comparing reference data with stored data. For SRAM (Static Random Access Memory), a memory cell has a 6 MOS structure constituted by two access transistors and a flip-flop including two inverters. For DRAM (Dynamic Random Access Memory), a memory cell is constituted by two devices, a selection transistor and a capacitor.

Figure 2:
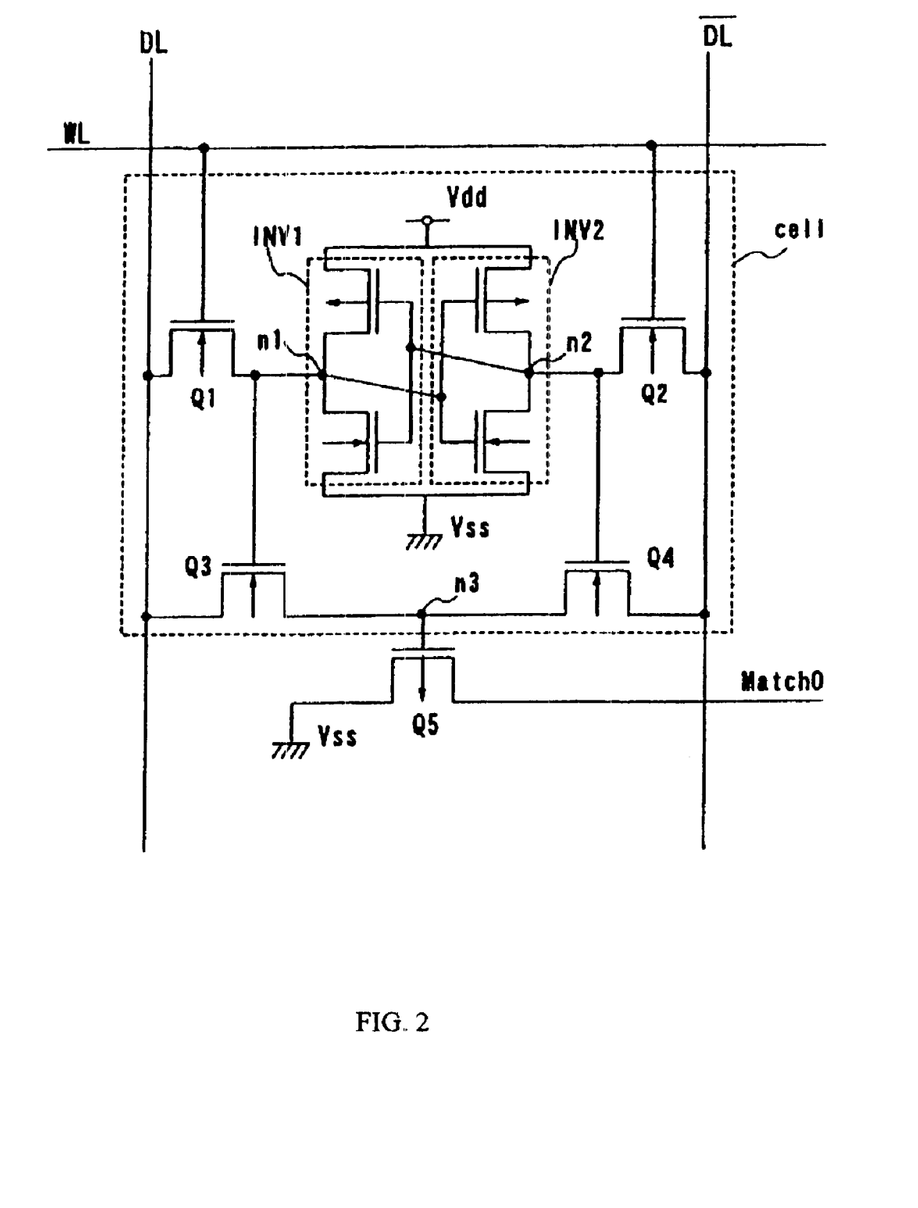
FIG. 2 is a circuit diagram showing an example of a content addressable memory (CAM) cell according to the embodiment.
Figure 3:
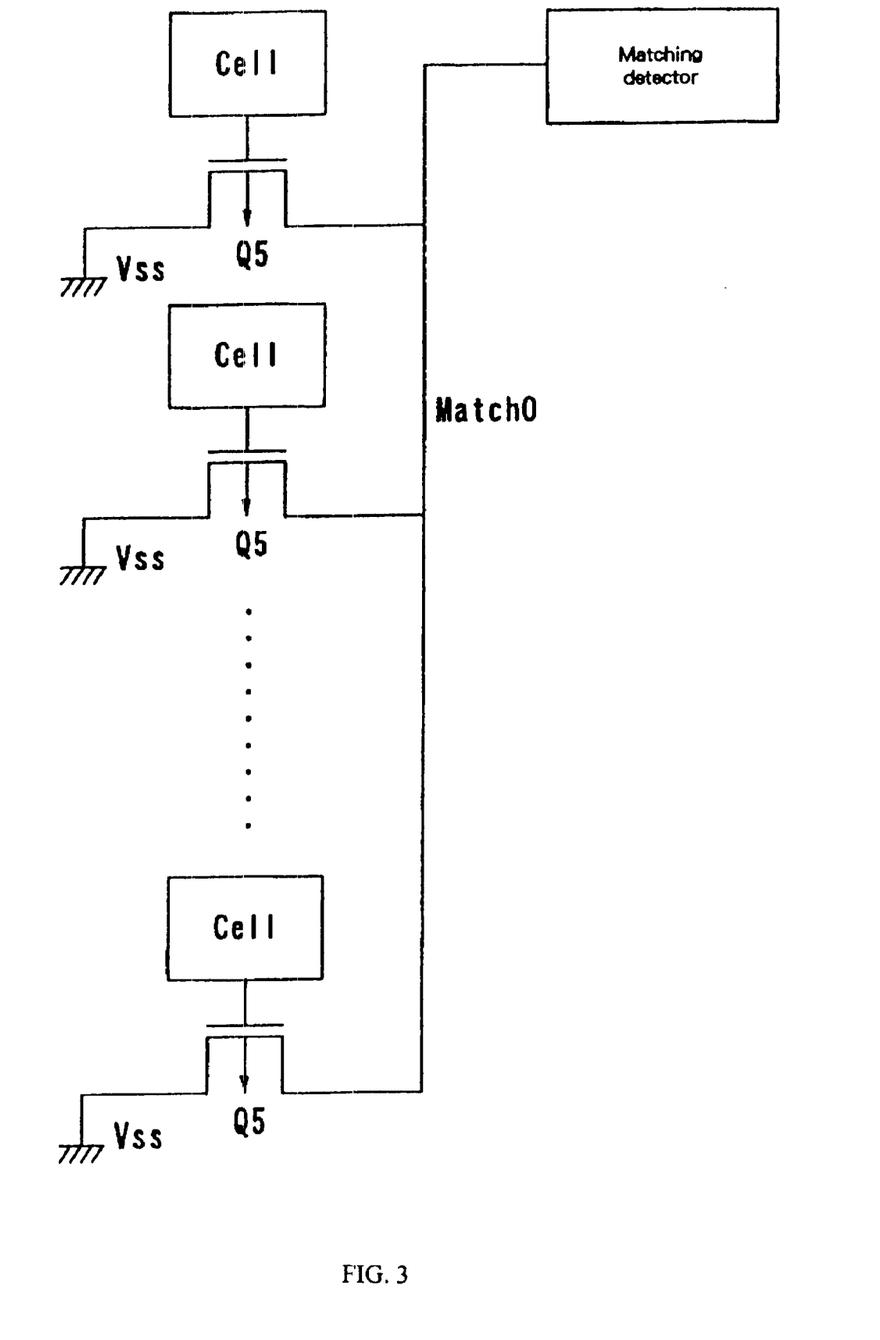
FIG. 3 is a block diagram showing an overview of a circuit for detecting the matching of CAM cells.

FIG. 2 is a circuit diagram showing an example of a CAM cell for this embodiment. FIG. 3 is a block diagram showing the overview of a circuit for detecting the matching of CAM memory cells along a word line WL. In this embodiment, SRAM is employed. A flip-flop circuit is constituted by inverters INVL and INV2 wherein a PMOS (a p-type MISFET) and an NMOS (an n-type MISFET) are connected in series. N-type selection transistors Q1 and Q2 are connected to nodes n1 and n2 of the flip-flop circuit, and the word line WL is connected to the gates of the transistors Q1 and Q2. When a selection operation is performed with the word line set high, the potentials at the nodes n1 and n2 are transmitted to data lines DL and /DL, and the reading or writing of information is performed. Naturally, at this time signals that are mutually complementary are output to the data lines DL and /DL. Mutually complemented signals are input to the data lines DL and /DL during a data search. The gates of n-type transistors Q3 and Q4 are connected to the nodes n1 and n2, while their drains are connected to the respective data lines DL and /DL respectively, and their common source is connected to the gate of a p-type transistor QS, which detects the matching of reference data and stored data. A match detection signal Match0 emitted by each cell is transmitted to a match detection circuit.

The transistors Q3, Q4 and QS examine data matching. When the potentials at the data lines DL and /DL match those at the nodes n1 and n2, the common source (node n3) of the transistors Q3 and Q4 goes high. At this time, the p-type transistor Q5 is in the OFF state. When the level of the match detection signal Match0 is pre-charged to high beforehand, and when the transistors QS in all the CAM cells along the word line WL are in the OFF state, the pre-charge level of the signal Match0 is maintained. Then, the high level signal is transmitted to the match detection circuit, which in turn detects the matching of data in the cells along the word line WL. When the potentials at the data lines DL and /DL do not match those at the nodes n1 and n2, the potential at the node n3 goes low, and the transistor Q5 is turned on. Then, when a non-match is found for at least one of the CAM cells along the word line WL, the charge of the signal Match0 is released and the signal Match0 goes low. In this manner, for each word, a match or a non-match can be detected for each memory cell and the data line. It should be noted that an EXCLUSIVE OR gate can be employed as the search device.

The word matching circuit 2 receives the search results (Match0) from the CAM array 1, and outputs a word match or non-match signal for each address.

The priority encoder 3 receives the result from the word matching circuit 2, and outputs a binary code address that corresponds to the address line along which the word is matched. When there are a plurality of matched words, the address having the highest priority is output. In this embodiment, the smallest address is output first. For the determination of the priority order, a high priority may be allocated for an address having a large address number. When no words match, the priority encoder 3 outputs a non-match signal.

The address decoder 4 receives the binary code signal for the address, and activates the address line corresponding to the address.

When data are written to the CAM array or a data search is initiated, the data writing/searching driver 5 transmits the data via a predetermined data line (reference data line).

During the process of reading data from the memory array, the sense amplifier 6 detects a potential (charge) representing the status of the data stored in the memory cell. A sense amplifier 6 is provided for each data line, or one active data line pair.

Figure 4:
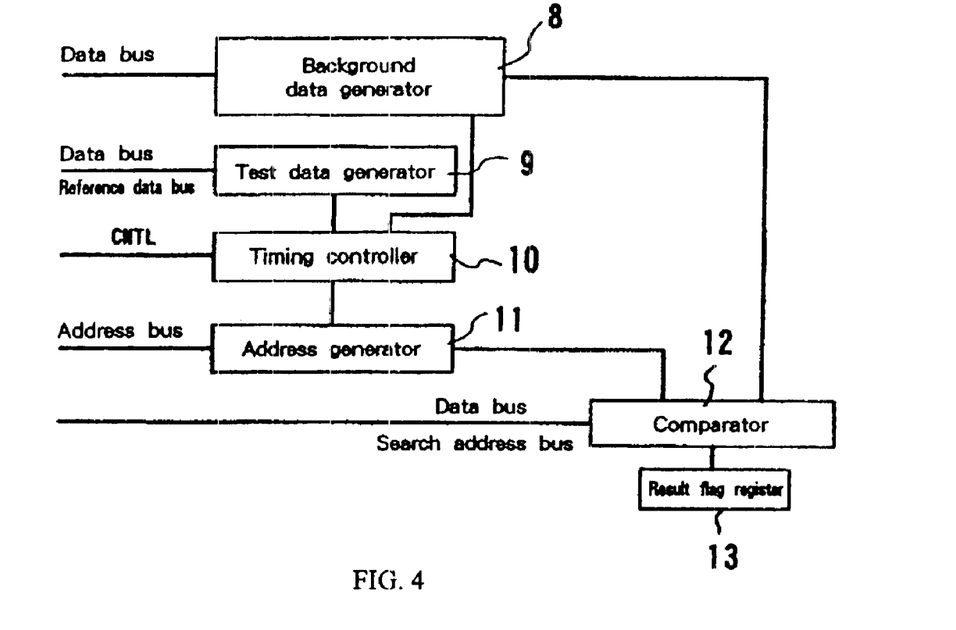
FIG. 4 is a block diagram showing an example of an arrangement of a built-in self test (BIST) circuit.

FIG. 4 is a block diagram showing an example of an arrangement for the built-in self test (BIST) circuit 7. The BIST circuit 7 in this embodiment includes a background data generator 8, a test data generator 9, a timing controller 10, an address generator 11, a comparator 12, and a result flag register 13.

The background data generator 8 generates background data to be written to the CAM array 1 at the beginning of a test. Under the control of the timing controller 10, these data are transmitted via a data bus.

At each testing step, the test data generator 9 generates test data to be written to a test address, and under the control of the timing controller 10, the data are transmitted via the data bus. Further, at each testing step, the test data are transmitted as reference data via a reference data bus.

The timing controller 10 controls the data transmission timing or the data reading timing for the background data generator 8, the test data generator 9, the address generator 11 and the comparator 12. In addition, the timing controller 10 transmits a test control signal CNTL to the other functional blocks of the CAM 1, such as the word matching circuit 2, the priority encoder 3, the address decoder 4 and the data writing/search driver 5. The timing controller 10 may include a counter function for the address positions, which will be described later.

At each testing step, the address generator 11 generates a test address. This test address differs for each testing step; the test address number is decremented by one each time a testing step is terminated. Since in this embodiment a higher priority is allocated by the priority encoder 3 to an address having a small number, the address generator 11 generates address numbers in descending order. It should be noted that if a high priority has been allocated for an address having a large address number, the address generator 11 generates address numbers in ascending order. Under the control of the timing controller 10, the address generator 11 transmits address data via an address bus.

The comparator 12 obtains, via the data bus, the data stored in the cell at each address in the CAM array 1, as well as the background data from the background data generator 8, and compares the data stored in the memory cell with the background data. The comparison result is then stored in the result flag register 13.

Finally, the comparator 12 obtains, via the search address bus, data (search addresses) from the priority encoder 3 and address data (test addresses) from the address generator 11, compares the search addresses with the test addresses, the comparison result is then stored in the result flag register 13.

Figure 5:
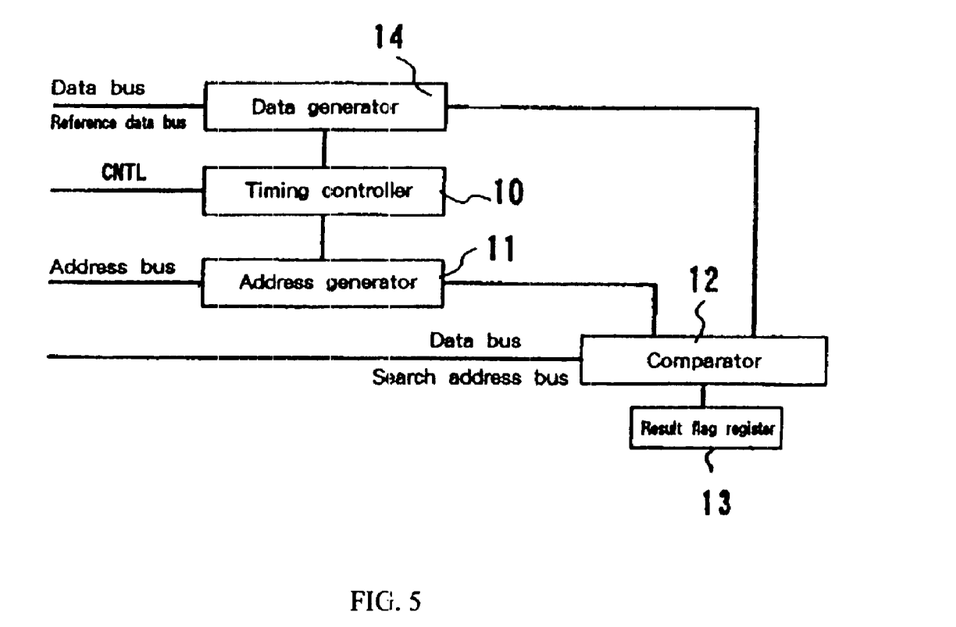
FIG. 5 is a block diagram showing another example of an arrangement of the BIST circuit.

In this embodiment, the comparator 12 has both a stored data comparison function (a data comparator) and an address data comparison function (an address comparator); however, separate circuits may be provided for the respective functions. Further, the structure of the built-in self test circuit 7 is merely an example, and the circuit 7 is not limited to this arrangement so long as it includes the functions for writing and reading the background data, the function for comparing the read data with the background data, the function for writing the test data to the test address, the search control function, and the function for comparing the search address with the test address. For example, as is shown in FIG. 5, the function of the background generator 8 and the function of the test data generator 9 may be combined to form a single data generator 14. In this case, the background data or the test data, which are compared by the comparator 12, can be generated under the control of the timing controller 10.

Figure 6:
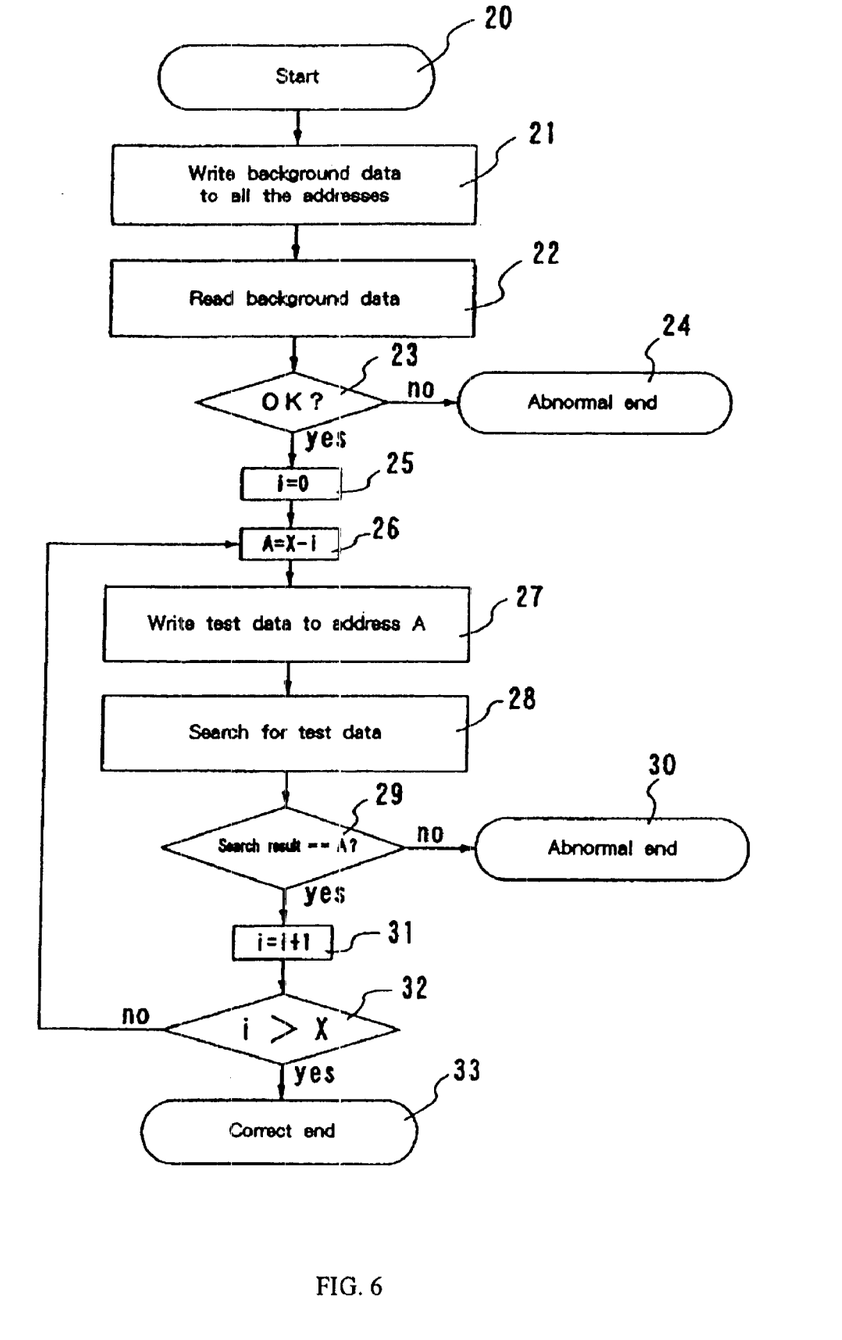
FIG. 6 is a flowchart showing an example of a testing method according to the embodiment.
Figure 7:
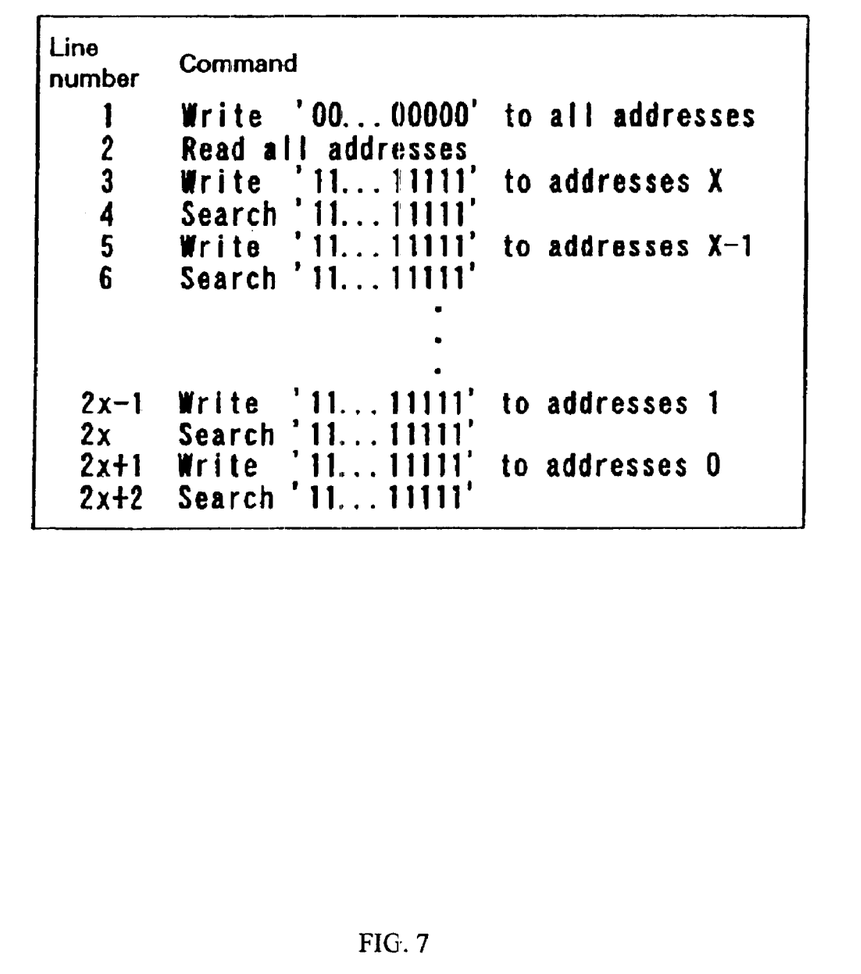
FIG. 7 is a diagram showing a pseudo command sequence representing the testing method according to the embodiment.

The testing method according to the embodiment will now be described while referring to FIGS. 6 and 7. FIG. 6 is a flowchart showing an example of a test method for this embodiment. FIG. 7 is a diagram showing a pseudo command sequence representing the testing method of the embodiment. The testing process is initiated at step 20.

First, the background data are written to all the addresses (all the memory cells) of the CAM array 1 (step 21, line number 1). For this processing, "000 . . . 00000" is shown as example background data, for which "0" is repeated the number of times that corresponds to the count of the bits in a word. The background data is not limited to "000 . . . 00000", and data having another bit pattern may be used.

The background data, for example, is written in the following manner. The timing controller 10 generates a write signal, and the background data generator 8, while designating the address generated by the address generator 11, transmits the background data via the data bus. Subsequently, the address provided by the address generator 11 is changed sequentially, and the above process is repeated until data is written to all the addresses.

Figure 8:
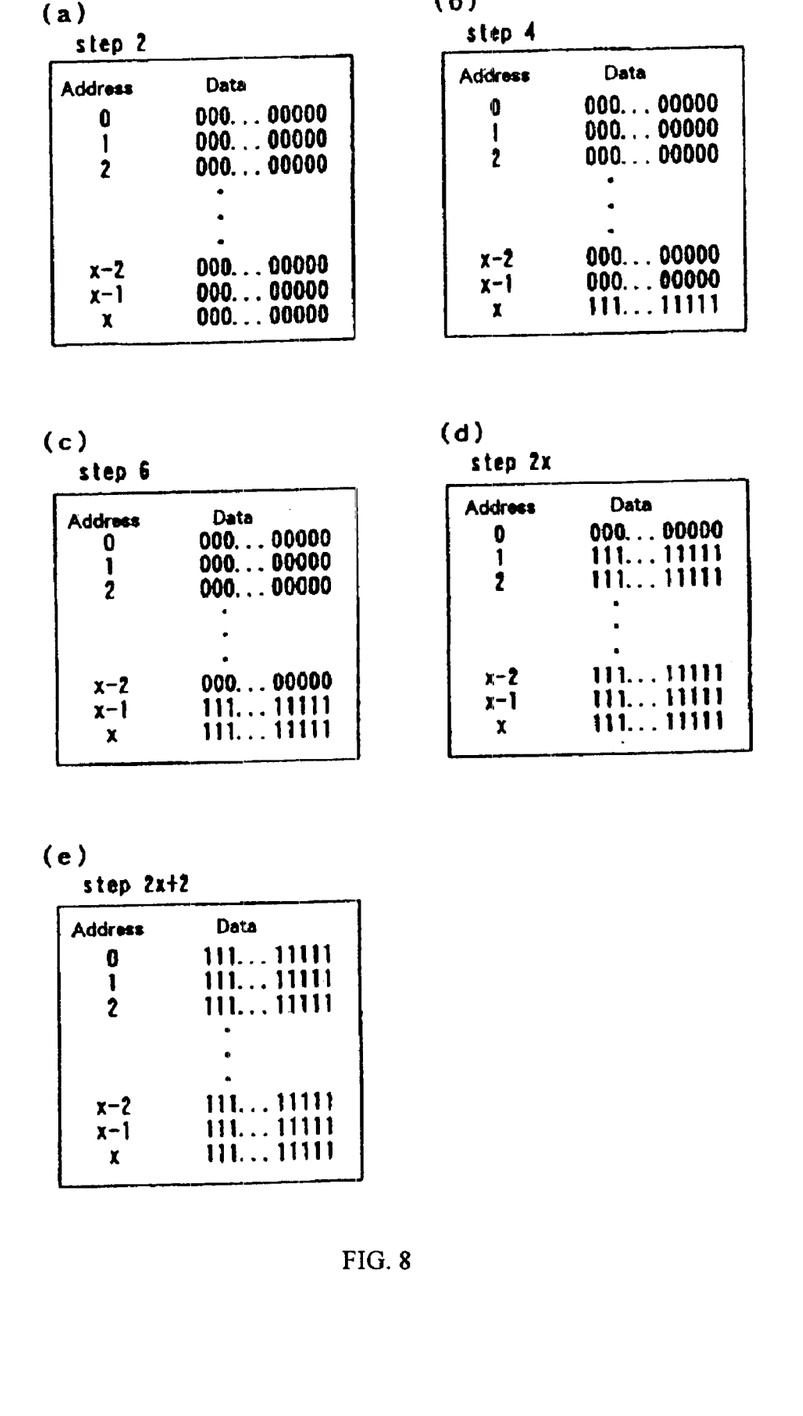
FIGS. 8(a) to 8(e) are diagrams showing data stored in the CAM array at the respective testing steps.

Then, the background data is read (step 22, line number 2). To read the background data, for example, the timing controller 10 generates a reading control signal and the read data is transmitted from the data bus to the comparator 12, which also receives the background data from the background data generator 8 and compares the two sets of data (step 23). Following this, if the data do not match, the processing is abnormally terminated (step 24). This processing is repeated for all the addresses until it has been confirmed that background data have been written to and read from all the memory cells, and when a memory cell passes the test at this step, the correctness of its writing and reading functions are confirmed. If at step 23 the data for all the addresses match, program control advances to step 25, and at this time, the data stored in the CAM array 1 is as shown in FIG. 8(*a*), with a "0" occupying each of the memory cells.

Following this, a value of 0 is substituted into a control flag i (step 25), and X−i is substituted into a test address number A, where X is the maximum address number (final address) (step 26). Thereafter, the test data are written to the address A (step 27, line number 3). The writing of the test data is performed in the following manner, for example. The timing controller 10 generates a write signal, and the test data generator 9, while designating the address generated by the address generator 11, transmits the test data via the data bus.

Since i=0, the test address for data writing is X. That is, the address generated by the address generator 11 at the current step is X. In this example, "111 . . . 11111" is shown as the test data, "1" being repeated the number of times that corresponds to the count of the bits in a word. It should be noted that the test data is not limited to "111 . . . 11111", and may be data having a bit pattern that differs from that of the background data.

Next, the CAM is searched by using the test data "111 . . . 11111" as reference data (step 28, line number 4). During the search process, the timing controller 10 generates a search signal, and the test data generator 9 transmits the test data via the reference data bus. Thereafter, the search result is output to the priority encoder 3 and is further transmitted via the search address bus to the comparator 12. The comparator 12 also receives the test address data (X at the current step) from the address generator 11, and compares the two sets of received data (step 29). When the two data sets do not match, the processing is abnormally terminated (step 30). But when the two data sets match, program control advances to step 31.

At the current step, the test data "111 ... 11111" is written only at the address X, and the background data "000 ... 00000" is stored in the other addresses. Thus, so long as the search function of the CAM 1 operates correctly, the search address X is output, and the matching of the data is output as the comparison result at step 29. The data stored in the CAM array 1 at this time are shown in FIG. 8($b$). The data "111 ... 11111" is written only at the address X, and the other data is "000 ... 00000".

Then, i is incremented by one (step 31), and a check is performed to determine whether i is greater than X (step 32). When i is greater than X, i.e., when the testing for all the addresses has been completed without detecting an abnormality, the processing is correctly terminated (step 33). And since currently i (=1) is equal to or smaller than X, program control returns to step 26. Thereafter, the above described steps are repeated.

At the second loop, a test address X−1 is designated (step 26), and the test data are written to the address X−1 (step 27, line number 5). At the current loop, the data "111 ... 11111" that were written at the address X during the preceding test are not deleted or rewritten, and are maintained unchanged. That is, only the test data are written at the address X−1.

As well as for the preceding loop, the search operation is performed by using the test data as reference data (step 28, line number 6). In this case, data matching the reference data "111 ... 11111" are stored at the addresses X and X−1. The data stored in the CAM array 1 at this time are as shown in FIG. 8($c$), with the data "111 ... 11111" being written at the addresses X and X−1, and the other data is "000 ... 00000".

Since a higher priority is defined by the priority encoder 3 for an address having a smaller address number, the search address X−1 is output as the search results. Therefore, at step 29 the matching of the data should be output as the comparison result.

The same loop is repeated until i exceeds X (step 32). FIG. 8($d$) is a diagram showing the data stored in the CAM array 1 one loop before the test is completed (line number 2X). FIG. 8($e$) is a diagram showing the data stored in the CAM array 1 when the testing has been completed (line number 2X+2). In the loop when the test is completed, address 0, which has the highest priority, is output as the search address.

As is described above, according to the embodiment, no operation is performed for an address that has been tested, and data writing is performed only for an address that is to be tested. That is, only one writing step (two steps including the writing of background data) is performed for one address. Therefore, a redundant deletion or writing step can be eliminated, and the number of writing steps required for testing can be minimized. Further, in the case that the writing circuit itself is mounted in a built-in self test circuit, only one writing circuit is required. Further, in this embodiment, not only the data writing and reading function for each memory cell of the CAM array 1, but also the operations of the word matching circuit and the priority encoder can be tested at the same time. In other words, a minimum number of steps are required to test the correctness of all the functions of the semiconductor device.

When the number of steps of writing and dummy search is compared between this embodiment and the test method according to the descending order of priorities, the method whereby the testing of the addresses follows the descending order of priorities requires the writing of a total of 5n−1, i.e., three, dummy search steps for the first address and 4(n−1) steps for the deletion of the preceding address data at the second and the following addresses, for the deletion and the dummy search for the current address data, and for the writing to the current address, whereas in this embodiment, the writing of only 2n steps is required, as is described above, so that the number of steps can be reduced considerably (to about 2/5). Especially when a plurality of test data patterns are prepared to conduct the test multiple times, more dramatic effects can be obtained due to the reduction in the writing of dummy search steps. For example, when the number of address words is 2048 and the number of test data patterns is 2, 20,478 writing dummy searches are required for the method whereby the testing of addresses follows in the descending order of priorities, while in this embodiment only 8,192 writing steps need to be performed.

It should be noted that, for testing addresses in the descending order of priorities, for example, in order to minimize the number of steps at which data corresponding to test data are written to addresses having lower priorities than the test address and to test the priorities allocated by the encoder with the same completeness as is provided for by this embodiment, the same data as the test data are written to all the addresses, and the data at addresses that were tested are rewritten.

When the testing algorithm is mounted in the built-in self test (BIST) circuit, and the writing circuits that are required by the embodiment and by the example whereby addresses are tested in the descending order of priorities are tested, it is found that in the latter case five types of circuits are required: a data writing circuit for testing the first address, a circuit for deleting from the preceding address data used for testing the second and the following addresses, a data deletion circuit and a data writing circuit for the current address, and a dummy search controller, whereas for this embodiment, only one circuit for writing data to the current address is required. For example, when the number of address words is 2048, the number of data patterns is 2 and the design rule is 0.25 1¼m, a device area of about 1250 cells is required for the example whereby addresses are tested in the descending order of priorities, whereas for this embodiment, a device area of only about 800 cells is required. Therefore, according to the embodiment of this invention the device area can be reduced by about 36%. The small device area will contribute to high device integration, and the power consumed by the BIST circuit will be reduced.

The present invention has been specifically described during the course of the embodiment; however, the invention is not limited to this embodiment, and can be variously modified without departing from the scope of the invention.

For example, whereas in this embodiment the invention is applied for SRAM or DRAM, it can also be applied to a nonvolatile memory cell, such as FRAM or flash EEPROM. And whereas in this embodiment the priorities allocated by the priority encoder can be shifted between the descending and the ascending order of address numbers, another rule can be selected to change the manner in which the priorities are allocated for address number. Furthermore, although in this embodiment the testing algorithm (method) of the invention has been mounted in the BIST circuit, this method may be implemented using a circuit located separate from the chip of the semiconductor device. In addition, arbitrary data patterns can be employed for the background data and the test data, so long as these data differ from each other.

Typical effects obtained by the invention are as follows: for one, in the testing performed for the search function of the CAM having the priority encoder, a redundant testing step can be eliminated; in addition, a minimum number of steps is required to detect failures in memory cells and in the word matching circuit; and, the priority encoder function can also be tested.

What is claimed is:

1. A method for testing a semiconductor device comprising:
   a background data writing step of writing background data to all the addresses in a content addressable memory array;
   a test data writing step of designating a test address allocated the lowest priority as defined by a priority encoder, and writing to said test address test data differing from said background data;
   a search address acquisition step of employing said test data as reference data to search data stored in said content addressable memory array, and obtaining from said priority encoder a search address whereat data matching said test data are recorded;
   an address comparing step of determining whether said test address matches said search address;
   sequentially changing said test address so as to raise a priority of said test address; and
   repeating said test data writing step, said search address acquisition step and said address comparing step only on addresses in the content addressable memory array that store said background data.

2. The semiconductor device testing method according to claim 1 that, following said background data writing step, further comprises:
   a data reading step of reading data from said content addressable memory cell; and
   a data comparing step of determining whether said data that is read matches said background data.

3. The semiconductor device testing method according to claim 2, wherein in said data comparing step a word match or non-match signal is outputted for each address.

4. The semiconductor device testing method according to claim 2, wherein said background data writing step, said data reading step, said data comparing step, said test data writing step, said search address acquisition step and said address comparing step are performed by a built-in self test circuit mounted in said semiconductor device.

5. The semiconductor device testing method according to claim 2, wherein said background data writing step, said data reading step, said data comparing steps said test data writing step, said search address acquisition step and said address comparing step are performed by a circuit mounted in a chip located separate from said semiconductor device.

6. The semiconductor device testing method according to claim 1, wherein said content addressable memory cell comprises a volatile memory cell.

7. The semiconductor device testing method according to claim 6, wherein said volatile memory cell comprises SRAM or DRAM.

8. The semiconductor device testing method according to claim 1, wherein said content addressable memory cell comprises a non-volatile memory cell.

9. The semiconductor device testing method according to claim 8, wherein said non-volatile memory cell comprises FRAM or flash EEPROM.

10. The semiconductor device testing method according to claim 1, wherein said priority encoder outputs a binary code address that corresponds to an address line along which a word is matched.

11. The semiconductor device testing method according to claim 1, wherein in said test data writing step address numbers are generated in descending order when a higher priority is allocated by said priority encoder to an address having a small address number, and ascending order when a higher priority is allocated by said priority encoder to an address having a large address number.

12. A semiconductor device comprising:
    a content addressable memory cell;
    a word matching circuit;
    a priority encoder;
    an address generator which generates addresses beginning with the address having the lowest priority as defined by said priority encoder;
    a background data generator which writes background data to all the addresses of said content addressable memory cell;
    a test data generator which obtains a test address from said address generator, and writes test data differing from said background data to said test address of said content addressable memory cell;
    an address comparator which determines whether said test address matches an address output by said priority encoder that searches for said test data;
    wherein said test address is sequentially changed so as to raise a priority of said test address, and firer wherein writing test data differing from said background data to said test address, searching for said test data and comparing said test address and an address output by said priority encoder are repeated only on addresses in the content addressable memory array that store said background data.

13. The semiconductor device according to claim 12, wherein a data generator comprises said background data generator and said test data generator.

14. The semiconductor device according to claim 12, further comprising:
    a data comparator which reads data from said content addressable memory cell to compare said data with said background data.

15. The semiconductor device according to claim 14, wherein said address generator, said test data generator, said address comparator, said background data generator and said data comparator are mounted as a built-in self test circuit in said semiconductor device.

16. The semiconductor device according to claim 14, wherein said address generator, said test data generator, said address comparator, said background data generator and said data comparator are located in a chip separate from said semiconductor device.

17. The semiconductor device according to claim 14, wherein said data comparator comprises a sense amplifier.

18. The semiconductor device according to claim 14, wherein said address comparator and said data comparator are the same comparator circuit.

19. The semiconductor device according to claim 14, wherein said address comparator and said data comparator are separate comparator circuits.

20. The semiconductor device according to claims 12, wherein said content addressable memory cell comprises a volatile memory cell.

21. The semiconductor device according to claim 20, wherein said volatile memory cell comprises SRAM or DRAM.

22. The semiconductor device according to claim 12, wherein said content addressable memory cell comprises a non-volatile memory cell.

23. The semiconductor device according to claim 22, wherein said non-volatile memory cell comprises FRAM or flash EEPROM.

24. The semiconductor device according to claim 12, wherein said word matching circuit comprises means for outputting a word match or non-match signal for each address.

25. The semiconductor device according to claim 12, wherein said priority encoder comprises means for outputting a binary code address that corresponds to an address line along which a word is matched.

26. The semiconductor device according to claim 12, wherein said address generator generates address numbers in descending order when a higher priority is allocated by said priority encoder to an address having a small address number, and ascending order when a higher priority is allocated by said priority encoder to an address having a large address number.

* * * * *